United States Patent [19]

Vermilyea

[11] Patent Number: 4,500,860
[45] Date of Patent: Feb. 19, 1985

[54] WINDING SUPPORT AND METHOD FOR NMR MAGNET AXISYMMETRIC CORRECTION COILS

[75] Inventor: Mark E. Vermilyea, Schenectady, N.Y.

[73] Assignee: General Electric Company, Schenectady, N.Y.

[21] Appl. No.: 628,077

[22] Filed: Jul. 5, 1984

[51] Int. Cl.³ .............................................. H01F 7/22
[52] U.S. Cl. .................................. 335/216; 324/370; 242/7.07; 29/599
[58] Field of Search ............... 335/216, 299; 376/142, 376/146; 324/318, 319, 320, 322; 29/599; 242/7.07

[56] References Cited

U.S. PATENT DOCUMENTS

| | | | |
|---|---|---|---|
| 3,469,180 | 9/1969 | Anderson | 324/320 |
| 3,577,067 | 5/1971 | Weaver | 324/320 |
| 4,363,981 | 12/1982 | Laskaris | 310/52 |
| 4,456,881 | 6/1984 | Compton | 324/319 |
| 4,467,303 | 8/1984 | Laskaris | 335/216 |

Primary Examiner—George Harris
Attorney, Agent, or Firm—Lawrence D. Cutter; James C. Davis, Jr.; Marvin Snyder

[57] ABSTRACT

A coil form for supporting both symmetric and antisymmetric magnetic field correction coils includes a system or circumferential slots and axial grooves disposed at various depths in the form to achieve the desired winding pattern. A winding method for this coil form is provided in which tension in the winding conductor, preferably a superconductive material, is maintainable at all times during assembly, and increased upon immersion in cryogenic fluid. Accordingly, the coil form and winding method provide a means for constructing axisymmetric coils which are resistant to frictional motion and which may be placed in direct contact with cryogenic fluids.

22 Claims, 9 Drawing Figures

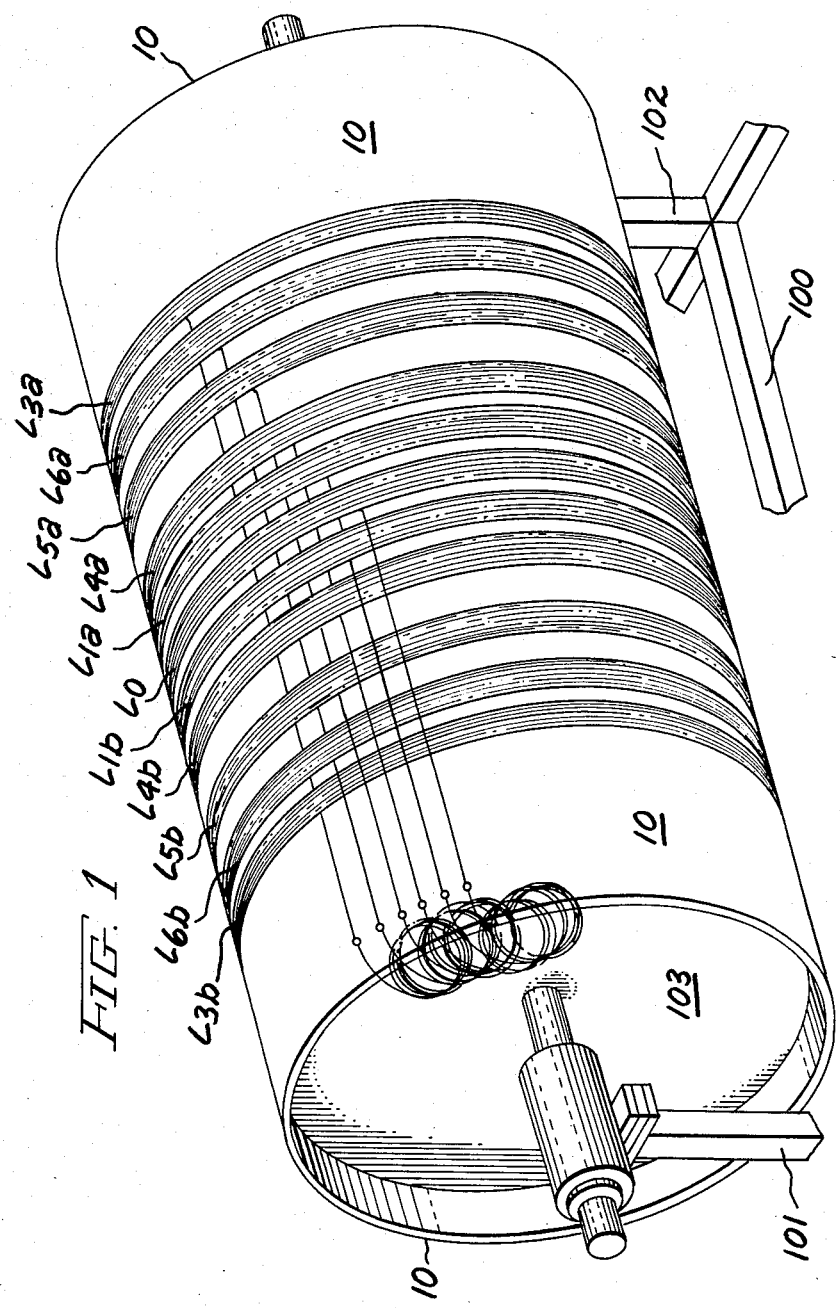

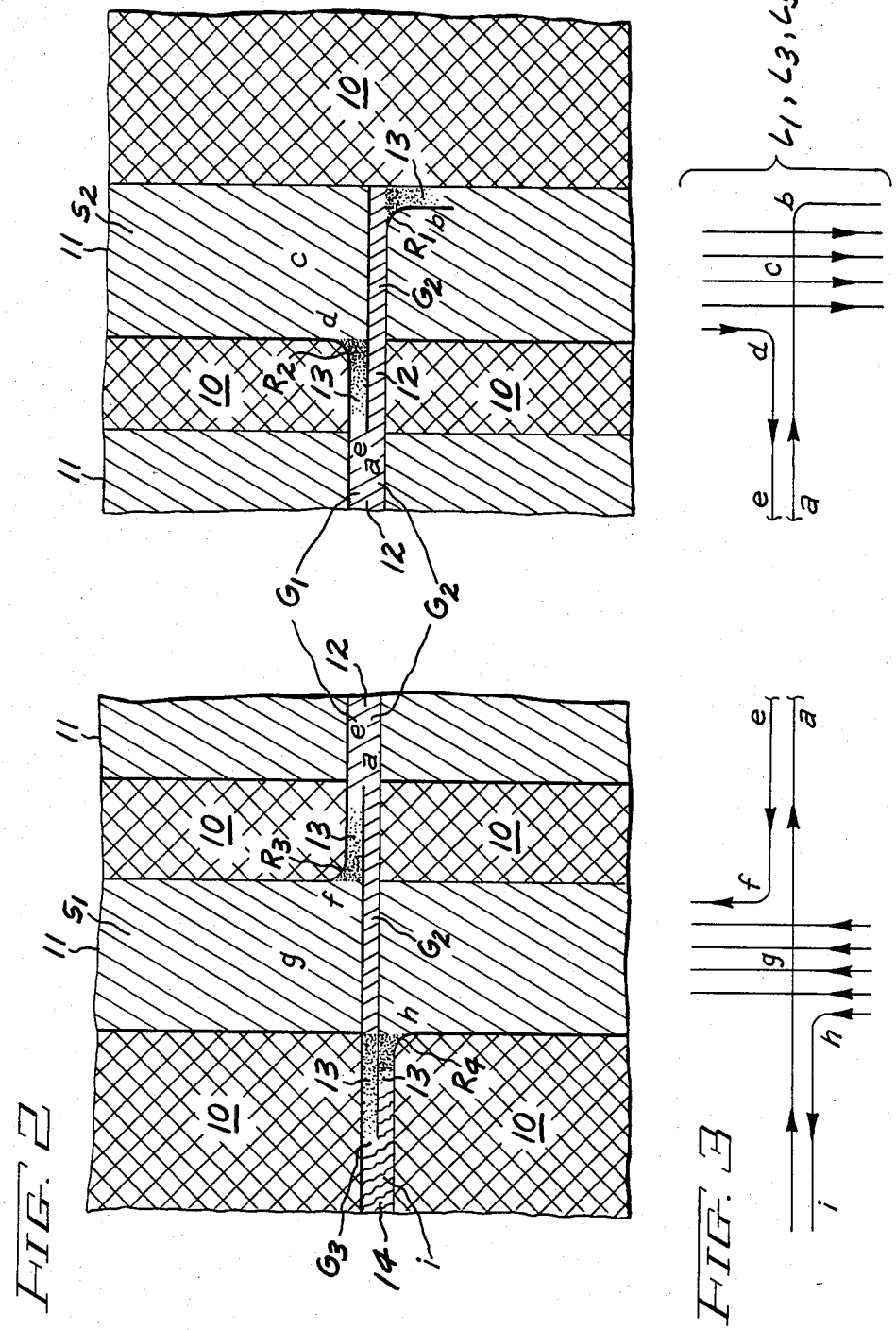

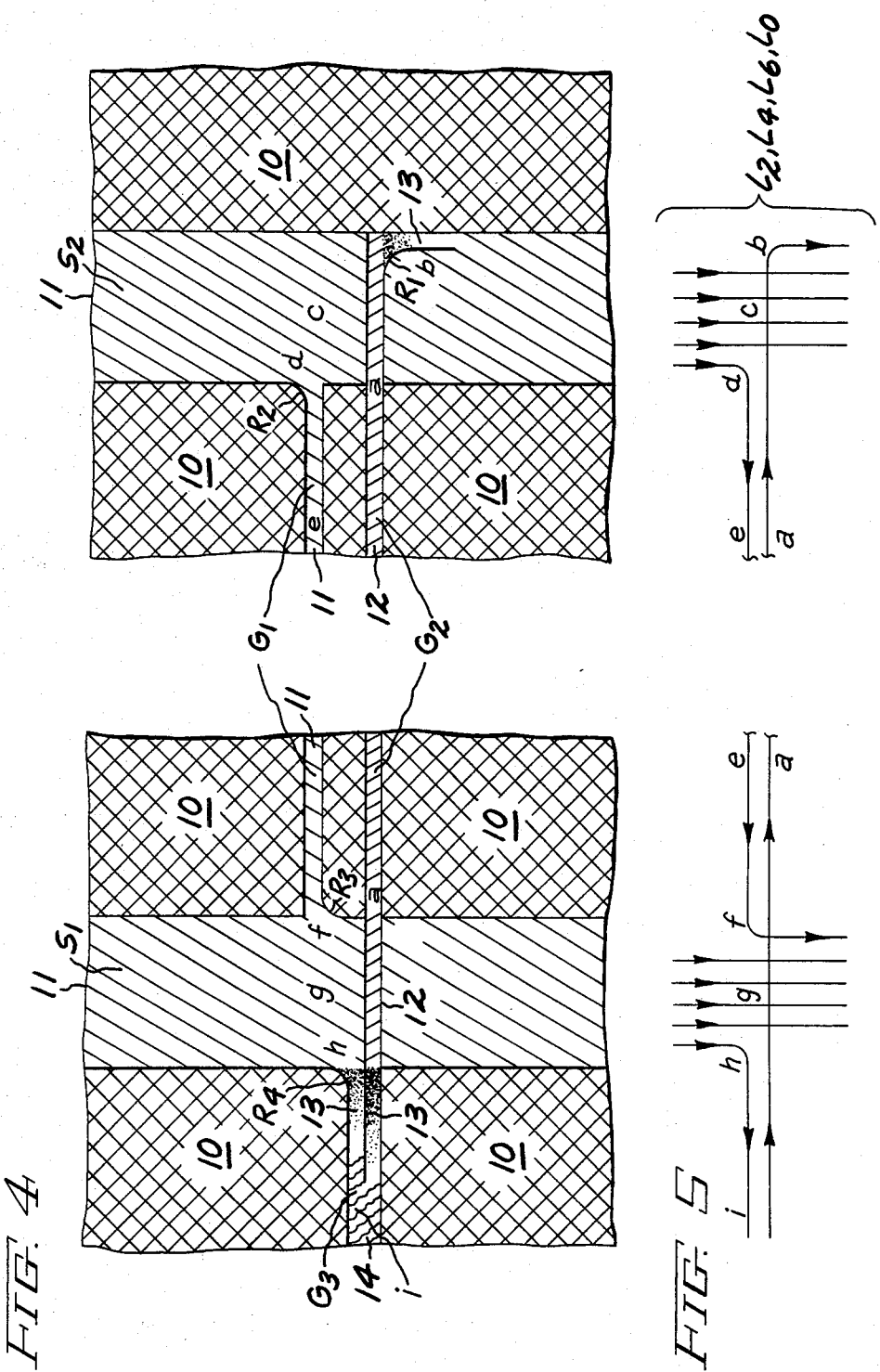

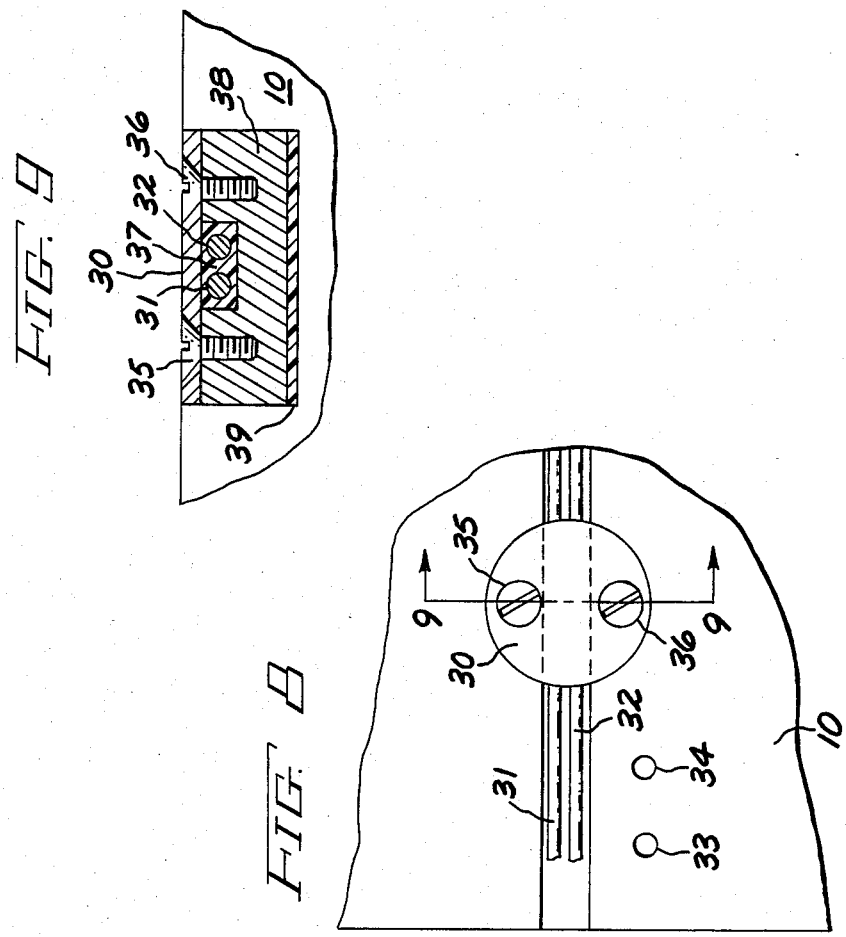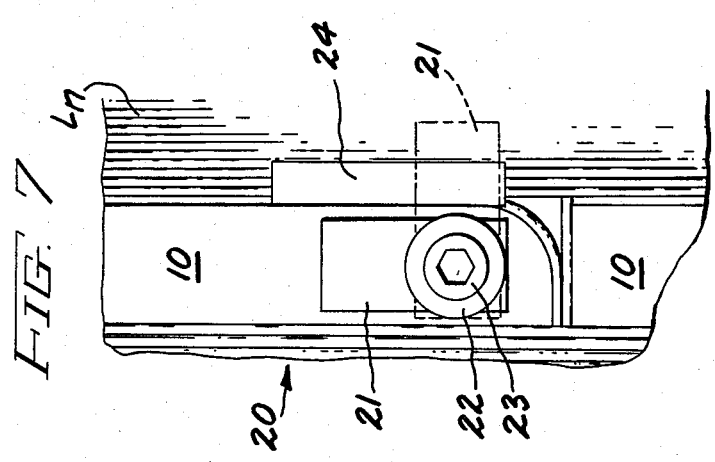

WINDING SUPPORT AND METHOD FOR NMR MAGNET AXISYMMETRIC CORRECTION COILS

BACKGROUND OF THE DISCLOSURE

The present invention relates to correction coils employable in nuclear magnetic resonance (NMR) imaging systems. More particularly the present invention relates to a coil form and a coil winding method for axisymmetric correction coils.

In NMR imaging systems, particularly those employed for medical diagnostic purposes, it is necessary to provide a highly uniform and high strength magnetic field. Superconducting magnet coils provide a desirable method for achieving such a field. Superconducting magnets offer a particular advantage in that once energized, no electrical power is needed to maintain the resulting magnetic field. Moreover, such magnets exhibit a high degree of temporal stability. However, NMR imaging imposes strict requirements upon the magnetic field uniformity. In order to reduce the presence of image artifacts, magnetic fields exhibiting spatial variations of only a few parts per million are desired. However, even slight manufacturing variations in the construction of the main magnet can adversely effect magnetic field uniformity. Accordingly, correction coils are generally required to provide corrective magnetic field components. Typically, the correction coils carry much less current than do the main magnet coils. Adjustment to the main field provided by correction coils are typically achieved by selecting appropriate current levels and current directions for the correction coils. In general, correction coils comprise coils or coil sets which are either axisymmetric or axiperiodic. Axisymmetric correction coils typically comprise coil loops which completely surround a cylindrical support form in the circumferential direction. These coils are particularly desirable in adjusting certain axial components of the magnetic field. The instant invention is particularly directed to the construction of such axisymmetric correction coils.

Axisymmetric correction coils are typically disposed on cylindrical coil forms in discrete coil pairs. These axisymmetric coils impose axial field gradients of different orders. One coil set is necessary for each gradient one wishes to affect. Therefore, several sets of axial coils are usually employed in a device having high magnetic field homogeneity. These sets usually consist of coil pairs, the current in which may be symmetric or antisymmetric about a midplane which bisects the cylindrical form and is perpendicular to the cylindrical axis. Accordingly, these coils sets are described as being configured as either an even or odd ordered coil pair depending on the electrical winding sense associated with each coil in the set. Furthermore, the high gradient strengths required for many applications make superconducting coils very desirable because of their high strength, their zero steady-state power requirements and their high temporal stability.

It is therefore desirable to be capable of winding several sets of odd and even axisymmetric superconducting coil pairs quickly and easily, preferably on one support structure to facilitate subsequent assembly into a cryostat along with the main magnet structure. These axisymmetric coils must operate in high magnetic fields since they are placed close to the main field windings so as to minimize liquid helium volume while maximizing magnet bore diameter. Electromagnetic forces for such high fields can cause coil motion, consequent heating, and possible quenching unless coils are well supported and/or well cooled.

Accordingly, many in the past have taught the desirability of pretensioning superconductive windings to prevent motion during operation. However, minimization of motion has typically been accomplished by such means as overbanding or impregnation with a glass fiber/epoxy composite for support. Furthermore, such pretensioning and overbanding methods have not been employed in the construction of NMR correction coil windings.

SUMMARY OF THE INVENTION

In accordance with a preferred embodiment of the present invention a coil form is provided which is especially useful for supporting superconductive windings of axisymmetric correction coils. This coil form comprises an insulative cylinder with at least two circumferential slots at a given depth. Additionally the cylinder includes first and second axial grooves at a second distinct depth. The first axial groove extends between the circumferential grooves and includes ramped transition portions and rounded corners at appropriate locations for maintenance of tension in the winding during assembly. The cylinder also includes a second axial groove at a specified depth; this groove extends across all of one of the circumferential slots and across substantially all of the second of these slots and terminates in a ramped portion with a rounded corner which bends around toward a circumferential direction. Coil forms manufactured in this way provide a means for winding both odd and even (antisymmetric and symmetric) axial correction coils.

In another embodiment of the present invention a method for coil winding employs the coil form of the present invention. In this method the coil windings are first laid in the second of said axial grooves described above, are then wound into the adjacent circumferential slot and then in the other of said axial grooves and finally in the second circumferential slot. This winding method also permits all of the coil connections to be supplied at one end of the coil form. In yet another embodiment of the winding method of the present invention a plurality of axisymmetric windings are provided on a single coil form each set being wound in the same manner as described above except that subsequent circumferential winding slots are disposed axially inwardly of previously wound slots. Finally a zeroth order axisymmetric coil may be employed to complete a set of axisymmetric correction coil windings.

Accordingly, it is an object of the present invention to provide a coil form for supporting superconductive windings for use in correction coils for NMR medical diagnostic systems.

It is also an object of the present invention to provide a method for winding coils on such coil forms.

It is yet another object of the present invention to provide a method for winding axisymmetric coils of superconductive material on a cylindrical coil form in such a way that tension is always maintainable in said winding during assembly, and increased upon immersion in a cryogenic fluid.

It is a still further object of the present invention to provide axisymmetric correction coils which are particularly useful in NMR imaging systems.

Lastly, but not limited hereto, it is an object of the present invention to provide NMR correction coils which exhibit minimal tendencies to quench, which are rigidly held in place and which exhibit long range temporal stability and spatial accuracy.

DESCRIPTION OF THE FIGURES

The subject matter which is regarded as the invention is particularly pointed out and distinctly claimed in the concluding portion of the specification. The invention, however, both as to organization and method of practice, together with further objects and advantages thereof, may best be understood by reference to the following description taken in connection with the accompanying drawings in which:

FIG. 1 is an isometric view illustrating a completely assembled set of axisymmetric coils wound on a coil form in accordance with the present invention.

FIG. 2 is a plan view of a portion of the coil form of the present invention illustrating the circumferential slots and axial grooves and in particular illustrating the depths associated therewith; the pattern shown is that which is particularly useful for the winding of odd or axisymmetric coils.

FIG. 3 is a schematic diagram illustrating the winding pattern employed in the slots and grooves shown immediately above in FIG. 2.

FIG. 4 is a view similar to FIG. 2 except that the groove and slot patterns for even or symmetric coil placement is shown.

FIG. 5 is a view similar to FIG. 3 except that it illustrates the placement of conductors in the slots and grooves shown immediately above in FIG. 4.

FIG. 7 is a plan view illustrating a clamping mechanism for temporarily holding down wire conductor, particularly around the rounded corners of the grooves in the coil form.

FIG. 8 is a plan view illustrating conductor fastening means employed at the end of the coil form.

FIG. 9 is a cross-sectional view of the fastening means seen in FIG. 8.

DETAILED DESCRIPTION OF THE INVENTION

Figure 6:
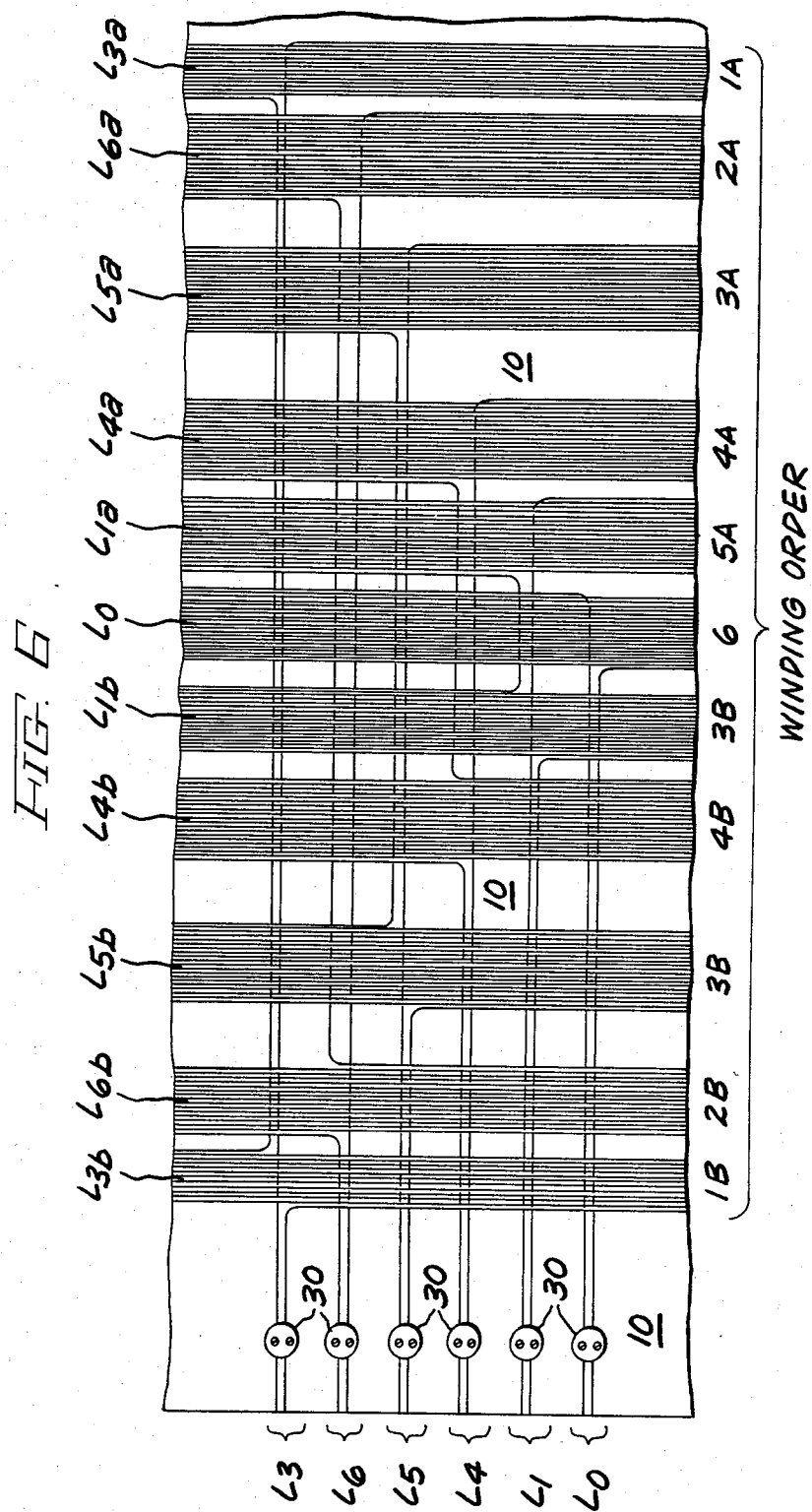
FIG. 6 is a plan view illustrating in detail the winding pattern employed in FIG. 1 in accordance with the present invention and more particularly illustrating a winding order for the three sets of odd and three sets of even coil sets employed along with the pattern for nominally even coil $L_0$.

FIG. 1 illustrates a completed embodiment of the present invention. A more detailed description of the winding pattern is also seen in FIG. 6 which is discussed more particularly below. In FIG. 1 coil form 10 of the present invention is seen supported on mandrel 103 which is supported on stand 100 having vertical supports 101 and 102. The mandrel and the stand are employed during assembly but do not constitute any part of the completed assembly. Coil form 10 provides support for odd or antisymmetric coils $L_1$, $L_3$ and $L_5$. Each of these coils comprises connected portions $L_{1a}$ and $L_{1b}$, $L_{3a}$ and $L_{3b}$ and $L_{5a}$ and $L_{5b}$, respectively. Additionally, the axial disposition of the axisymmetric coils along the length of coil form 10 is generally carefully selected to provide correction for certain orders of gradients. Also, the coil pairs are disposed in symmetrical locations about a midplane which bisects the axis of cylindrical coil form 10. This plane is not shown. Similarly, even coils $L_4$ and $L_6$ are also shown disposed on coil form 10 in pairs $L_{4a}$ and $L_{4b}$, and $L_{6a}$ and $L_{6b}$, respectively. Coil $L_0$ is also shown disposed so that it is essentially bisected by the above-described midplane. Accordingly, $L_0$ is a nominally even coil. Although not readily discernable from FIG. 1, the even coils are wound so that each coil in the pair is wound in the same circumferential direction around coil form 10. Likewise, the odd axial coils are wound so that the coils in each pair are wound in circumferentially opposed directions; such coils are said to have opposite polarities. This aspect of the present invention is best illustrated by comparing FIGS. 3 and 5 which are discussed below.

FIG. 2 illustrates a plan view of a portion of the surface of coil form 10. More particularly, FIG. 2 illustrates the depth pattern for the slots and grooves of the coil form of the present invention. For convenience of understanding, the axial cuts in coil form 10 are referred to as grooves with the circumferential cuts in coil form 10 being referred to as slots. FIG. 2 is also directed only to the slot and groove patterns associated with a single pair of axisymmetric coils which are wound in an odd or antisymmetric pattern. The hatching and stipling shown in FIG. 2 do not illustrate sectioned views, but rather illustrate regions of different depth. In particular, region 10 shown as a doubly hatched area represents the cylindrical surface of the coil for (zero depth). Region 11 which is hatched from right to left and top to bottom represents an area of the coil form which has been machined to a depth of approximately h. Accordingly, it is seen that circumferential slots $S_1$ and $S_2$ in which coil windings are ultimately disposed each has a depth of h. Similarly FIG. 2 illustrates the presence of groove $G_1$ which extends between the circumferential slots. This groove together with groove $G_2$ is machined to a depth of approximately h+d, where d typically represents the diameter of the wire employed in the windings. It is also seen that groove $G_2$ is machined to a depth of h+d for a substantial portion of its length. Accordingly, those regions designated with the reference numeral 12 are hatched from left to right and top to bottom to indicate a depth of approximately h+d. Grooves $G_1$ and $G_2$ each include ramped transistion portions 13 which extend from a lower depth to a higher depth. FIG. 2 also illustrates that in the region between circumferential slots $S_1$ and $S_2$ grooves $G_1$ and $G_2$ may be coextensive and form in practice a single, somewhat wider groove (odd coils only). For purposes of clarity, ramped transition portions 13 are stipled. Finally, relatively shallow groove $G_3$ is seen extending to the left toward the end of coil form 10 from circumferential slot $S_1$. Groove $G_3$ is also designated by depth reference numeral 14 and is shaded with wavy lines to indicate a typical depth which is distinct from that shown for the other regions of FIG. 2. In particular, groove $G_3$ typically possesses a depth of h−d. All depths are measured from the radially outer surface of cylindrical coil form 10.

Another important aspect of the present invention is the presence of rounded corners $R_1$, $R_2$, $R_3$, and $R_4$, as shown. These corners provide transition regions from circumferential to axial directions and vice versa. Moreover, the numbering of the subscripts on the rounded corner reference designations is important in understanding the sequence in which the coils of the present invention are wound. The rounded corners provide a means for changing direction of winding (from circumferential to axial or from axial to circumferential) while at the same time providing the ability to maintain tension in the conductive coil winding. Lastly, for ease of understanding, FIG. 2 also includes letter designations a, b, c, d, e, f, g, h, and i which are provided for convenience in understanding applicant's claimed winding process which is more particularly described below. The reference letters a-i designating various assembly steps are also provided in FIGS. 3, 4 and 5 for the same purpose. FIG. 3 more particularly illustrates the winding pattern that exists in the slots and grooves of FIG. 2. The alphabetic order of the reference letters a-i coil form 10. In particular, the process proceeds from step a to step i, which for example means that wire is disposed first in groove $G_2$ (step a), then in slot $S_2$ (step c), then in slot $G_1$ (step e), then in slot $S_1$ (step g) and then finally in groove $G_3$ (step i).

FIGS. 2 and 3 are therefore seen as indicating the method in which even coils in the present invention are wound. In particular, a conductor is first laid in slot $G_2$ and is then bent around rounded corner $R_1$ from an axial to a circumferential direction. The conductor is then wound in slot $S_2$ in the direction indicated in FIG. 3, so that the conductor fills slot $S_2$. The presence of rounded corner $R_1$ helps to maintain tension in the conductor (see as also discussion below with respect to FIG. 7) it is wound and fills slot $S_2$ with the conductor. The tension is highly desirable to ensure motionless coil operation. The winding is then bent around a second rounded corner $R_2$ so as to lie in axially extending groove $G_1$. The conductor is then bent around a third rounded corner $R_3$ so that the conductor is now oriented in a circumferential direction (step f in FIGS. 2 and 3). Again, the wire is maintained under tension and is wrapped in a circumferential direction in slot $S_1$ so as to fill slot $S_1$ in a flat, helical pattern as in slot $S_2$. At step h, the wire is bent around rounded corner $R_4$ so as to lie in an axial direction and is then placed in axial groove $G_3$. Accordingly, it is seen that this winding method provides a means for maintaining the coil under tension and at the same time providing input and output leads for a pair of axial correction coils which exhibit oppositely oriented winding directions. Accordingly, the odd coils are wound so as to have opposing electrical senses (senses). It is also noted that the arrows in FIG. 3 indicate not only the stops in the winding method but also the relative direction of current flow.

The winding of symmetrical or even axial coils is accomplished in much the same manner as the winding of odd coils as shown in FIGS. 2 and 3. The coil form of the present invention and the winding process is however more particularly illustrated for even coils in FIGS. 4 and 5. For example, an even coil is wound as follows. The conductor for the coil is first laid in slot $G_2$ and then is bent around rounded corner $R_1$ and then is lain in circumferential slot $S_2$ at the end of which the conductor is bent around rounded corner $R_2$ so as to lie in an axial direction which renders it possible to dispose the conductor in groove $G_1$. Following this operation the conductor is bent around corner $R_3$ so as to now extend in a circumferential direction which renders it possible to dispose the conductor in a flat helical pattern in slot $S_1$ at the end of which the conductor is bent around corner $R_4$ and thence into exit groove $G_3$. Again, the conductor is maintained under tension during the winding operation, this tension maintenance being particularly facilitated by the presence of rounded corners $R_1$ through $R_4$. The winding pattern is also particularly appreciable from the schematic wiring diagram shown in FIG. 5. It is also useful to note that one of the primary differences between the winding method for even and odd coils is the location of rounded corner $R_3$. In FIG. 2 it is seen that rounded corners $R_2$ and $R_3$ are shown disposed on the same side of groove $G_1$. However, in FIG. 4 rounded corners $R_2$ and $R_3$ are shown on diagonally opposite corners of groove $G_1$. Additionally, the depths of grooves $G_1$ and $G_2$ are not generally the same for symmetric coils.

While FIGS. 2-5 are particularly directed to the winding of a single pair of axisymmetric correction coils, FIG. 6 is more particularly directed to the winding scheme employed when more than one set of such coils is to be disposed on a single coil form. This is the typical case for NMR magnetic field correction coils. In particular, the axially outermost coil pairs are wound first. In particular, odd axisymmetric coil $L_3$ is the first to be wound. The winding order is shown along the bottom edge of FIG. 6. In particular, 1A indicates that coil $L_{3a}$ is the first to be wound, with coil $L_{3b}$, having the winding order designation 1B, is the second to be wound. Similarly, winding order designations 2A and 2B (in that order) corresponding to coils $L_{6a}$ and $L_{6b}$ respectively are the next coils to be wound. In this fashion, the coils are wound successively starting from the outermost circumferential slots and working towards the axially innermost circumferential slots with winding order designations, 3A, 3B, 4A, 4B, 5A and 5B and 6 occurring in that order. The last coil to be wound is nominally even coil $L_0$. Additionally, FIG. 6 illustrates the various bending directions and the relative depths at which the various windings are disposed. FIG. 6 also illustrates the presence of the top portion 30 of a means for holding the conductors in their axial grooves under tension, upon completion of the winding operation. For a further discussion of this mechanism, see the discussion below with respect to FIGS. 8 and 9.

To ensure the maintenance of tension in the windings, hold down means may be employed adjacent to the rounded corners of the coil form of the present invention. Such hold down means is illustrated in FIG. 7. In particular, hex head bolt 23 with washer 22 may be employed to hold down tab 21. Tab 21 may be swung into the position shown in phantom view so as to hold down TEXTOLITE ™ strip 24. Pressure is applied evenly so as not to unnecessarily strain the winding conductor which preferably comprises a niobium-titanium superconductive material. It is however to be noted that bolt 22, washer 23, tab 21 and strip 24 are temporary structures which are removed once the coil is completely wound. Additionally, it is also seen from FIG. 7 that the rounded corners are desirably slightly undercut so as to be more able to maintain the wire in the groove or slot and also to maintain the wire under tension.

Once the windings are completely disposed in the circumferential and axial slots, means must be provided to maintain the windings in the slots on a permanent basis. Accordingly, a mechanism such as that illustrated in FIGS. 8 and 9 is employed. For example, conductors 31 and 32 are fixed in copper plug 38 by means of epoxy 37. Likewise, plug 38 is disposed in a disc shaped recess in form 10 and held therein by means of epoxy adhesive 39. Copper coverplate 30 is then affixed to plug 38 by means of screws 35 and 36. In FIG. 8, screw holes 33 and 34 are shown to indicate the fact that TEXTOLITE ™ strips and clamping arrangements such as is shown in FIG. 7 may also be employed to hold conductors 31 and 32 in an axial groove while adhesive 37 is setting or curing. Once in place the clamping structure is removed leaving only screw holes 33 and 34 as an indication of their placement.

In the present invention coil form 10 preferably comprises glass fiber reinforced epoxy material. This material was chosen primarily because of its thermal contraction, which is less than that of most superconductive materials employable for the coil windings. For the particular glass fiber epoxy and winding pattern used the cumulative shrinkage from room temperature to 77° K has been measured as being between 1.8 to 2.2 mils per inch, while that of the superconductor used is approximately 2.9 mils per inch. From this difference, a pretension may be specified for the superconductor which, when augmented by the tension increase due to cooling, brings the superconductor to its yield stress. This design maximizes the electromagnetic force required to move the conductor, thus allowing operation in the design magnetic field at the highest current possible without quenching due to frictional heating. Epoxy impregnation could increase this allowable current. However, such impregnation complicates both the winding process and the evaluation of cryogenic stability by introducing many poorly known factors into the design. Additionally, the glass fiber/epoxy composite is a low density material with excellent electrical insulation properties.

It is also seen that the winding method of the present invention allows for the maintenance of tension in each coil individually since tension must be temporarily removed from the paths in order to change winding direction and to run the wire axially to another coil slot, as well as when the coil pair is finished. To this end, the clamping mechanism shown in FIG. 7 is provided. Accordingly, coil form 10 may also be provided with threaded screw holes, (not shown in FIGS. 1-6) adjacent to the rounded corners.

Accordingly, from the above, it should be appreciated that the coil form and winding method of the present invention provide axisymmetric correction coils which are particularly useful in NMR imaging systems. In particular, it is seen that the coil structure of the present invention provides structural strength, rigidity, minimal conductor motion and requires neither banding nor epoxy impregnation to achieve these goals. Additionally, it is seen that the axisymmetric coils of the present invention therefore exhibit a very small thickness in the radial direction so as to minimize the volume of cryogenic fluids employed. The coil form and winding method of the present invention also provide a means for maintaining as much tension as is necessary in the coil conductor as it is being wound. This factor is again important in cryogenic applications since thermal contraction over a temperature difference of almost 200° C. (from assembly to use) is indeed a very large temperature range. The coil form and winding method of the present method also are seen to provide means for disposing many axisymmetric coils on the same coil form without resort to an overly complicated multidimensional layering operation involving complex machining of the coil form itself. Accordingly, it is seen that the coil form and method of the present invention allows the axisymmetric coils to be operated at yield stress and yet at the same time provides the maximum possible frictional resistance to axial motion. Additionally, the coils are capable of even better cooling by the liquid cryogen since the coils may be placed in direct contact with a cryogenic fluid and do not require fiberglass reinforced epoxy banding.

While the invention has been described in detail herein in accord with certain preferred embodiments of thereof, many modifications and changes therein may be effected by those skilled in the art. Accordingly, it is intended by the appended claims to cover all such modifications and changes as fall within the true spirit and scope of the invention.

The invention claimed is:

1. A coil form, especially for supporting superconductive windings for axial NMR magnetic field correction coils, said form comprising:

an insulative cylinder;

said cylinder having at least two circumferential slots therein at a depth of approximately h from the surface of said cylinder;

said cylinder also having a first axial groove therein at a depth of approximately h+d from the surface of said cylinder, said groove extending at this depth for a substantial portion of the length of said first groove, said first axial groove extending between said circumferential slot, said first axial groove also having two ramped transition portions from the depth of said first groove to the depth of said circumferential slots, said ramped transition portions each being disposed adjacent to one of said circumferential slots, said coil forms also exhibiting two rounded corners at the junction of said first axial groove and said circumferential slots;

said cylinder also having a second axial groove therein at a depth of approximately h+d from the surface of said cylinder, said second axial groove extending at this depth for a substantial portion of the length of said second groove, said second axial groove extending at said depth of h+d across all of a first one of said circumferential slots, said second axial groove extending at said depth of h+d across almost all of the second of said circumferential slots, said second axial groove also having a ramped transition portion from the depth of said second groove to the depth of the second of said circumferential slot, said ramped portion extending in the circumferential direction, said coil form also exhibiting a rounded corner at the junction of said second axial groove and the ramped portion of said second axial groove at the point where said second axial groove changes direction.

2. The coil form of claim 1, especially for use with axial coil pairs in which current flows in opposite circumferential directions, in which said rounded corners associated with said first axial groove are disposed on the same side of said groove 2.

3. The coil form of claim 2 in which said first and second axial grooves are substantially identical in the region between said circumferential slots.

4. The coil form of claim 2 further including additional pairs of distinct circumferential slots on associated first and second axial grooves.

5. The coil form of claim 2 further including a third axial groove at a depth of approximately h−d from the surface of said cylinder, said third axial groove being disposed adjacent to the axially exterior portion of said first circumferential slot, said third axial groove also exhibiting a ramped transition portion from a depth of h to a depth of approximately h−d, said ramped portion being disposed adjacent to the axially exterior portion of said first circumferential groove, said cylinder also possessing a rounded corner at the junction of said third axial groove with said first circumferential slot.

6. The coil form of claim 2 in which said second axial groove exhibits a second ramp portion from a depth of approximately $h+d$ to a depth of approximately $h-d$, said ramped portion beginning at the axially exterior portion of said first circumferential slot said ramped portion extending in an axially exterior direction, said second axial groove also extending at a depth of approximately $h-d$ for a distance extending axially exterior to said first circumferential slot.

7. The coil form of claim 1, especially for use with axial coil pairs in which current flows in the same circumferential direction, in which said rounded corners associated with said first axial groove are disposed on diagonally opposite sides of said groove, so that coils wound in said circumferential slots may be wound having the same sense.

8. The coil form of claim 7 further including additional pairs of distinct circumferential slots and associated first and second axial grooves.

9. The coil form of claim 7 further including a third axial groove at a depth of approximately $h-d$ from the surface of said cylinder said third groove being disposed adjacent to the axially exterior portion of said first circumferential slot, said third axial groove also exhibiting a ramped transition portion from a depth of h to a depth of approximately $h-d$, said ramped portion being disposed adjacent to the axially exterior portion of said first circumferential groove, said cylinder also possessing a rounded corner at the junction of said third axial groove with said first circumferential slot.

10. The coil form of claim 7 in which said second axial groove exhibits a second ramp portion from a depth of approximately $h+d$ to a depth of approximately $h-d$, said ramped portion beginning at the axially exterior portion of said first circumferential slot, said ramped portion extending in an axially exterior direction, said second axial groove also extending at a depth of approximately $h-d$ for a distance extending axially exterior to said first circumferential slot.

11. The coil form of claim 1 in which said cylinder comprises an epoxy/glass fiber composite the thermal contraction of which is substantially less than that of the superconductor, causing the tension in the winding to be increased upon cooling.

12. The coil form of claim 1 further including additional pairs of distinct circumferential slots and associated first and second axial grooves.

13. The coil form of claim 1 further including an axial coil disposed on said coil form in a manner determined by said slots and grooves.

14. The coil of claim 13 in which said axial coil comprises superconductive material.

15. The coil form of claim 1 in which said rounded corners are undercut, whereby wire passing around said corner may be more firmly held in place particularly during coil winding operations.

16. A method for winding axial coil pairs on a cylindrical coil form so that tension in the conductor of said coil is maintainable during assembly, said coil winding method comprising:
(a) laying said conductor in a first axial groove which extends from one end of said coil form, across a first circumferential slot in said coil form, and across almost all of a second circumferential slot in said form;
(b) bending said wire around a first rounded corner in said form at the end of said first axial groove so that said conductor is oriented in a circumferential direction;
(c) winding said conductor in said circumferential direction from step (b) so as to fill said second circumferential slot;
(d) bending said conductor around a second rounded corner in said coil form so that said conductor is oriented in an axial direction toward said circumferential slot;
(e) laying said conductor in a second axial groove extending between said first and second circumferential slots;
(f) bending said conductor around a third rounded corner in said coil form at the end of said second circumferential groove, so that said conductor is oriented in a circumferential direction;
(g) winding said conductor in said circumferential direction from step (f) so as to fill said first circumferential slot;
(h) bending said conductor around a fourth rounded corner in said coil form so that said conductor is oriented in an axial direction; and
(i) laying said conductor in a third axial groove extending from said first circumferential slot to the end of said coil form approximal to said first circumferential slot.

17. The coil winding method of claim 16 in which, at step (f), said wire is bent in a direction such that said windings in said first and second circumferential slots have the same electrical sense.

18. The coil winding method of claim 16 in which, at step (f), said wire is bent in a direction such that said windings in said first and second circumferential slots have the opposite electrical sense.

19. The coil winding method of claim 16 in which steps (a)–(i) are repeatedly applied, each time with subsequent circumferential slots which have distinct axial grooves associated with each slot pair.

20. The coil winding method of claim 19 further including:
(j) laying a final conductor in a final axial groove which extends from the end of said coil form proximal to said first slot, across almost all of a final circumferential slot is said form;
(k) bending said final conductor around a first rounded corner in said form at the end of said final axial groove, so that said final conductor is oriented in a circumferential direction;
(l) winding said final conductor in said circumferential direction from step (k) so as to fill said final circumferential slot;
(m) bending said final conductor around a final rounded corner in said coil form, so that said conductor is oriented in an axial direction toward said first circumferential slot from step (a); and
(n) laying said final conductor in a final axial groove extending to the end of said coil form which is proximal to said first circumferential slot from step (a).

21. The coil winding method of claim 16 in which said conductor of said coil comprises superconductive material.

22. The coil winding method of claim 16 in which said cylindrical coil form comprises a glass fiber/epoxy composite.

* * * * *